United States Patent
Mizutani et al.

(10) Patent No.: US 8,242,648 B2
(45) Date of Patent: Aug. 14, 2012

(54) CONTROL CIRCUIT MEMBER AND MOTOR

(75) Inventors: Nobuo Mizutani, Toyohashi (JP);
Shingo Omori, Toyohashi (JP);
Mitsuhiro Takada, Hamamatsu (JP);
Hiroyuki Takikawa, Kosai (JP)

(73) Assignee: Asmo Co., Ltd. (JP)

( * ) Notice: Subject to any disclaimer, the term of this patent is extended or adjusted under 35 U.S.C. 154(b) by 351 days.

(21) Appl. No.: 12/650,003

(22) Filed: Dec. 30, 2009

(65) Prior Publication Data

US 2010/0176696 A1  Jul. 15, 2010

(30) Foreign Application Priority Data

Jan. 14, 2009 (JP) ................................. 2009-006025
Jan. 22, 2009 (JP) ................................. 2009-011794

(51) Int. Cl.
*H02K 11/00* (2006.01)
*H02K 23/66* (2006.01)
(52) U.S. Cl. .......... 310/68 B; 310/68 R; 310/71; 310/83
(58) Field of Classification Search ................ 310/68 B, 310/68 R, 71, 83; *H02K 11/00, 23/66*
See application file for complete search history.

(56) References Cited

U.S. PATENT DOCUMENTS

| 5,245,258 | A | 9/1993 | Becker et al. | |
| 6,528,915 | B1* | 3/2003 | Moskob | 310/71 |
| 6,710,484 | B2* | 3/2004 | Kitoh et al. | 310/83 |
| 7,183,682 | B2* | 2/2007 | Yamashita et al. | 310/75 R |
| 2003/0137202 | A1* | 7/2003 | Mao et al. | 310/68 R |
| 2003/0178908 | A1* | 9/2003 | Hirano et al. | 310/239 |
| 2005/0280324 | A1* | 12/2005 | Yamashita et al. | 310/75 R |
| 2006/0113852 | A1* | 6/2006 | Adachi et al. | 310/71 |
| 2010/0176696 | A1* | 7/2010 | Mizutani et al. | 310/68 B |

FOREIGN PATENT DOCUMENTS

JP  2006-006062 A  1/2006

* cited by examiner

*Primary Examiner* — John K Kim
(74) *Attorney, Agent, or Firm* — Ceasar, Rivise, Bernstein, Cohen & Pokotilow, Ltd.

(57) ABSTRACT

A control circuit member provided in a motor is disclosed. The motor includes a motor main body having a rotary shaft and a gear housing integrated with the motor main body. The control circuit member includes a circuit substrate on which a rotation detecting element is mounted and a substrate support member. The circuit substrate is accommodated in a circuit accommodating portion in the gear housing. The substrate support member supports the circuit substrate inside the circuit accommodating portion. The control circuit member is configured to be insertable into the circuit accommodating portion along the axial direction of the rotary shaft. The circuit substrate is configured to be arrangeable inside the circuit accommodating portion while being inclined with respect to the axial direction of the rotary shaft, so as to cause the rotation detecting element to approach the detector magnet.

13 Claims, 6 Drawing Sheets

CONTROL CIRCUIT MEMBER AND MOTOR

The present invention relates to a control circuit member including a circuit substrate on which a rotation detecting element is mounted, and to a motor provided with the control circuit member.

BACKGROUND OF THE INVENTION

Conventional motors include a motor disclosed in, for example, the specification of U.S. Pat. No. 5,245,258. The motor includes a motor main body including a rotary shaft, a gear housing, which accommodates a reduction gear for reducing the rotation speed of the rotary shaft, and a control circuit member. The gear housing is integrated with the motor main body. The control circuit member is accommodated in a circuit accommodating portion provided in the gear housing. The control circuit member includes a circuit substrate, on which a rotation detecting element (such as a Hall IC) for detecting rotation information of the rotary shaft is mounted. The circuit substrate includes an element mounting portion for mounting the rotation detecting element (such as a Hall IC) on the circuit substrate. The rotation detecting element needs to be arranged at a position near a detector magnet that is provided on and rotates integrally with the rotary shaft, and at a position facing the magnet. Thus, the element mounting portion of the circuit substrate extends to the vicinity of the detector magnet. The circuit substrate is assembled to the circuit accommodating portion of the gear housing by inserting the circuit substrate along the extending direction of the element mounting portion (perpendicular to or inclined with respect to the axial direction of the rotary shaft).

However, in the above-mentioned motor, the circuit substrate is assembled to the circuit accommodating portion of the gear housing along the direction perpendicular to or inclined with respect to the axial direction of the rotary shaft, whereas the motor main body and the gear housing are assembled along the axial direction of the rotary shaft. Thus, the assembly of the circuit substrate to the circuit accommodating portion is complicated.

SUMMARY OF THE INVENTION

Accordingly, it is an objective of the present invention to provide a control circuit member in which a circuit substrate is easily assembled to a circuit accommodating portion, and a motor.

To achieve the above objective, a first aspect of the present invention provides a control circuit member provided in a motor. The motor includes a motor main body having a rotary shaft and a gear housing, which is integrated with the motor main body. The gear housing accommodates a reduction gear for reducing rotation speed of the rotary shaft. The control circuit member includes a circuit substrate, a rotation detecting element, and a substrate support member. The circuit substrate is accommodated in a circuit accommodating portion provided in the gear housing. The rotation detecting element is mounted on the circuit substrate. The rotation detecting element is arranged to face a detector magnet that is provided on and rotates integrally with the rotary shaft. The substrate support member supports the circuit substrate inside the circuit accommodating portion. The control circuit member is configured to be insertable into the circuit accommodating portion along the axial direction of the rotary shaft. The circuit substrate is configured to be arrangeable inside the circuit accommodating portion while being inclined with respect to the axial direction of the rotary shaft, so as to cause the rotation detecting element to approach the detector magnet.

A second aspect of the present invention provides a motor including a motor main body having a rotary shaft, a gear housing, and a control circuit member. The gear housing is integrated with the motor main body. The gear housing accommodates a reduction gear for reducing rotation speed of the rotary shaft. The control circuit member is accommodated in a circuit accommodating portion provided in the gear housing. The control circuit member includes a circuit substrate and a substrate support member. The circuit substrate is accommodated in the circuit accommodating portion provided in the gear housing. The circuit substrate is arranged to face a detector magnet that is provided on and rotates integrally with the rotary shaft. The substrate support member supports the circuit substrate in the circuit accommodating portion. The circuit accommodating portion is configured to receive the control circuit member along the axial direction of the rotary shaft. The circuit substrate is configured to be arrangeable inside the circuit accommodating portion while being inclined with respect to the axial direction of the rotary shaft, so as to cause the rotation detecting element to approach the detector magnet.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF THE PREFERRED EMBODIMENTS

Figure 1:
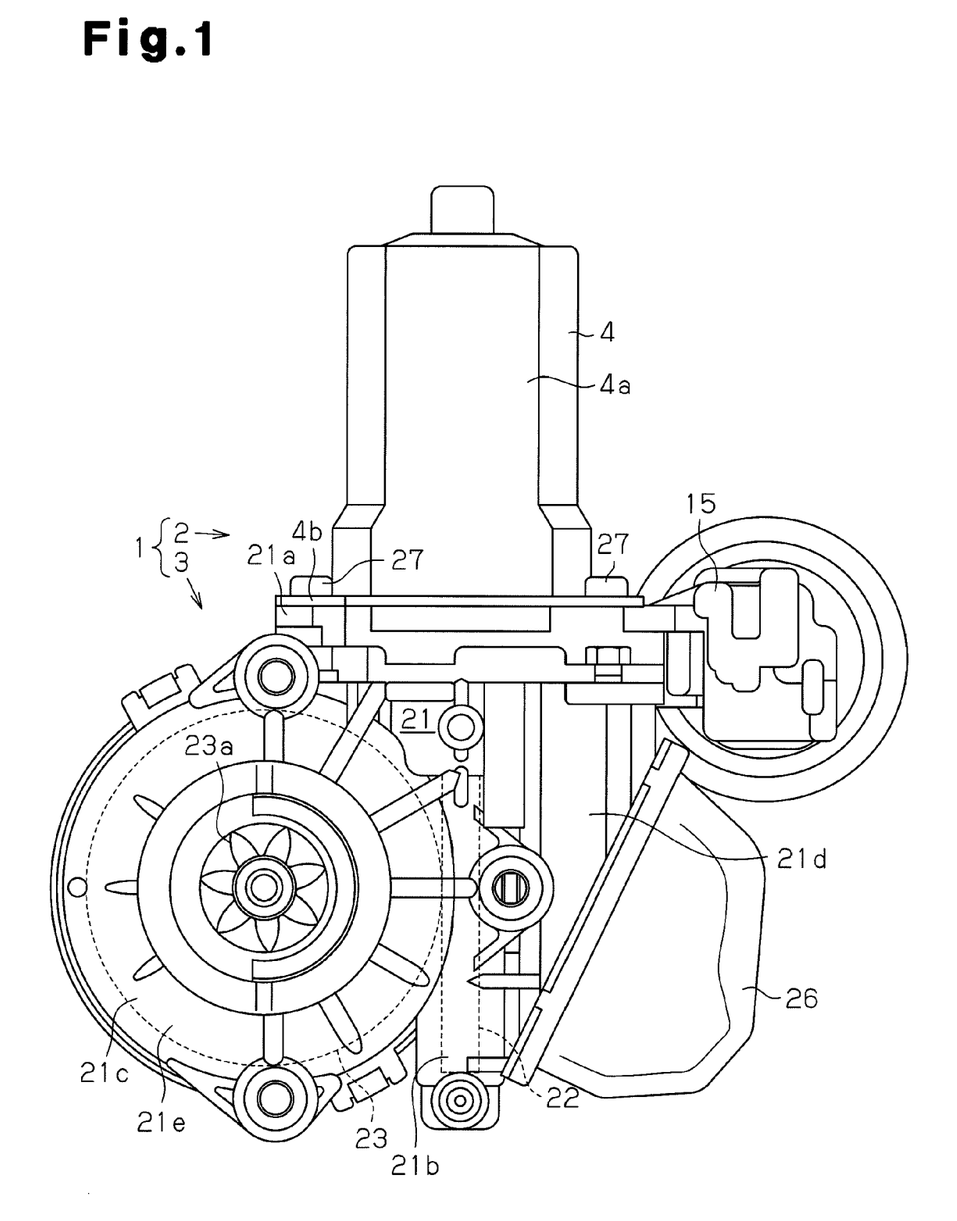
FIG. 1 is a side view illustrating a motor according to a first embodiment of the present invention.

A first embodiment of the present invention will now be described with reference to FIGS. 1 to 4D. A motor 1 shown in FIG. 1 is used in a power window apparatus for selectively opening and closing the window glass of a vehicle. The motor 1 includes a motor main body 2 and a reduction section 3, which reduces and outputs rotation of the motor main body 2.

Figure 2:
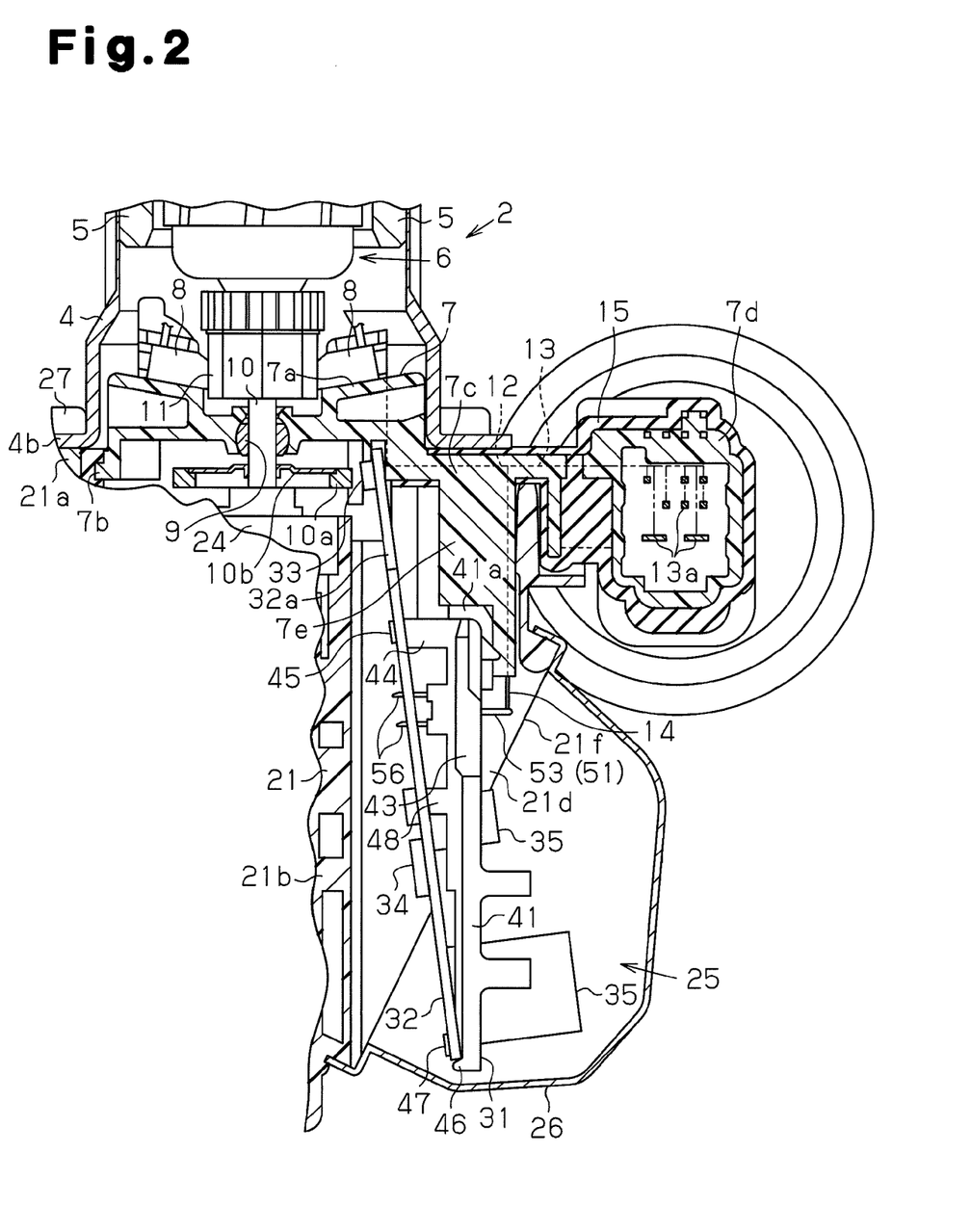
FIG. 2 is a partial cross-sectional view illustrating the motor of FIG. 1.

As shown in FIGS. 1 and 2, the motor main body 2 includes a yoke housing (hereinafter, simply referred to as the yoke) 4, a pair of magnets 5, an armature 6, a brush holder 7, and a pair of power supply brushes 8. The yoke 4 is substantially flattened cup-shaped, and the magnets 5 are secured to the inner surface of the yoke 4. The armature 6 is rotatably supported by the yoke 4 inside the yoke 4.

The brush holder 7 is formed of resin material, and includes a holder main body 7a, a flange portion 7b, an extended portion 7c, a connector portion 7d, and a terminal support portion 7e. The holder main body 7a, the flange portion 7b, the extended portion 7c, the connector portion 7d, and the terminal support portion 7e are formed integrally. The holder main body 7a is arranged in the yoke 4 in the vicinity of the opening of the yoke 4. The holder main body 7a has a bearing 9, which rotatably supports the distal end section of a rotary shaft 10 of the armature 6. The distal end of the rotary shaft 10 projects to the outside of the yoke 4, and a sensor magnet 10a (detector magnet) is secured to the projecting portion via a metal plate 10b. The holder main body 7a also retains the power supply brushes 8, which are arranged to slide along a commutator 11 secured to the rotary shaft 10. The power supply brushes 8 are arranged inside the yoke 4.

The flange portion 7b extends from the holder main body 7a like a flange, that is, the flange portion 7b extends radially outward about the rotary shaft 10. The extended portion 7c projects radially outward from one end (rightward in FIGS. 1 and 2) of the flange portion 7b along a flat surface 4a (see FIG. 1, a surface parallel to the sheet of FIGS. 1 and 2) of the yoke 4, and the connector portion 7d is formed on the distal end of the extended portion 7c. A non-illustrated external connector can be fitted to the connector portion 7d from the direction perpendicular to the flat surface 4a (from the rear side of the sheet of FIGS. 1 and 2 in the direction perpendicular to the sheet). The terminal support portion 7e extends from the extended portion 7c in the axial direction of the rotary shaft 10.

Also, brush terminals 12 and connector terminals 13 are embedded (insert molded) in the brush holder 7. The brush terminals 12 extend from the interior of the yoke 4 along the extended portion 7c. The power supply brushes 8 are electrically connected to the proximal ends of the brush terminals 12 via pigtails. The connector terminals 13 extend from the connector portion 7d along the extended portion 7c. The proximal ends of the connector terminals 13 are exposed at the connector portion 7d, and form an external connecting terminal 13a. When the external connector is fitted to the connector portion 7d, the terminal of the external connector is electrically connected to the connector terminals 13.

Also, the distal ends of the brush terminals 12 and the connector terminals 13 extend from the terminal support portion 7e along the axial direction of the motor main body 2 (downward in FIG. 2), and are exposed to the outside. Parts of the terminals 12, 13 exposed to the outside form internal connecting terminals 14. The internal connecting terminals 14 are arranged next to one another along the direction perpendicular to the flat surface 4a (perpendicular to the sheet of FIG. 2). Since the internal connecting terminals 14 are arranged next to one another in the direction perpendicular to the sheet of the drawing, only one is shown in FIG. 2.

Also, the flange portion 7b, the extended portion 7c and the connector portion 7d of the brush holder 7 are almost completely covered by a waterproof member 15 formed of elastomer except the part of the connector portion 7d corresponding to the external connecting terminal 13a.

The reduction section 3 reduces the rotation speed of the rotary shaft 10 of the motor main body 2. As shown in FIG. 1, the reduction section 3 includes a gear housing 21, a worm shaft 22, a worm wheel 23, a clutch 24 (see FIG. 2), a control circuit member 25, and a cover 26. The worm shaft 22 and the worm wheel 23 form a reduction gear.

The gear housing 21 is formed of a resin material. The gear housing 21 includes a securing portion 21a, a worm accommodating portion 21b, a wheel accommodating portion 21c, and a circuit accommodating portion 21d.

The securing portion 21a is formed into a shape that corresponds to a flange portion 4b formed at the opening of the yoke 4. The securing portion 21a is secured to the flange portion 4b with screws 27. The flange portion 7b of the brush holder 7 and the waterproof member 15 are sandwiched by the securing portion 21a and the flange portion 4b.

The worm accommodating portion 21b is cylindrical and extends along the extension of the rotary shaft 10, and rotatably supports the worm shaft 22 therein. Also, the clutch 24, which drivingly connects the worm shaft 22 and the rotary shaft 10 to each other, is provided inside the worm accommodating portion 21b at a part close to the motor main body 2 as shown in FIG. 2. While transmitting the drive power from the rotary shaft 10 to the worm shaft 22, the clutch 24 locks rotation of the worm shaft 22 such that drive power from the worm shaft 22 is not transmitted to the rotary shaft 10. That is, the clutch 24 is provided to prevent the motor 1 from being rotated by the force applied from the load.

The wheel accommodating portion 21c has a flat disk-like shape, and the central axis of the wheel accommodating portion 21c extends in a direction perpendicular to the longitudinal direction of the worm accommodating portion 21b. The worm wheel 23 is rotatably accommodated in the wheel accommodating portion 21c. The worm accommodating portion 21b partially communicates with the wheel accommodating portion 21c, and the worm shaft 22 meshes with the worm wheel 23 at the communicating part. Also, the wheel accommodating portion 21c is formed on the side of the worm accommodating portion 21b opposite to the connector portion 7d, that is, on the left side in FIG. 1. Also, a flat surface 21e of the wheel accommodating portion 21c is formed to be parallel to the flat surface 4a of the yoke 4. As the entire gear housing 21, the surface viewed from the direction perpendicular to the flat surface 21e serves as a flat surface of the gear housing 21.

The circuit accommodating portion 21d is formed such that the internal connecting terminals 14 are arranged inside the circuit accommodating portion 21d. More specifically, the circuit accommodating portion 21d is formed on the side of the worm accommodating portion 21b opposite to the wheel accommodating portion 21c, and between the worm accommodating portion 21b and the connector portion 7d. That is, the circuit accommodating portion 21d is formed in a dead space of the motor 1 in the structure without the control circuit member 25. The inside of the circuit accommodating portion 21d communicates with the part of the worm accommodating portion 21b close to the motor main body 2 (part corresponding to the sensor magnet 10a). Also, an opening 21f is formed in the circuit accommodating portion 21d such that the control circuit member 25 is insertable into the circuit accommodating portion 21d from the direction along the axial direction of the rotary shaft 10. The opening direction of the opening 21f is set such that the opening direction (the direction perpendicular to the opening 21f) is inclined with respect to the axial direction of the rotary shaft 10 and the direction perpendicular to the axial direction of the rotary shaft 10. The opening 21f of the present embodiment is formed on a straight line that connects the connector portion 7d and the distal end of the worm accommodating portion 21b, that is, part of the worm accommodating portion 21*b* opposite to the motor main body 2 as viewed from the direction perpendicular to the flat surface of the gear housing 21. The internal connecting terminals 14 of the brush terminals 12 and the connector terminals 13 are arranged at a position exposed to the outside as viewed from the opening direction of the opening 21*f*. The control circuit member 25 is substantially accommodated in the circuit accommodating portion 21*d*.

The control circuit member 25 includes a substrate support member 31, which is secured to the circuit accommodating portion 21*d* of the gear housing 21, and a circuit substrate 32, which is supported by the substrate support member 31 as shown in FIG. 2 and FIGS. 4A to 4D.

The substrate support member 31 is formed of a resin material, and includes a base portion 41, which extends parallel to the axial direction of the rotary shaft 10. The base portion 41 is formed into a frame-like shape and includes insertion portions 42*a*, 42*b*, which extend in a direction perpendicular to the axial direction of the rotary shaft 10 as shown in FIG. 4D. The insertion portion 42*a* is rectangular and located at a longitudinally middle portion of the base portion 41. The insertion portion 42*b* is located below the insertion portion 42*a*, and is formed as a notch. A pair of press-fitting portions 43 (assembling portions), which are press-fitted into the circuit accommodating portion 21*d*, are formed on both widthwise sides of the base portion 41. Also, an abutment portion 41*a* is formed on a first end of the base portion 41 in the longitudinal direction, that is, on the end of the base portion 41 close to the motor main body 2. The abutment portion 41*a* abuts against the terminal support portion 7*e* of the brush holder 7 in the axial direction of the rotary shaft 10 and the direction perpendicular to the axial direction of the rotary shaft 10 (see FIG. 2).

Figure 4A:
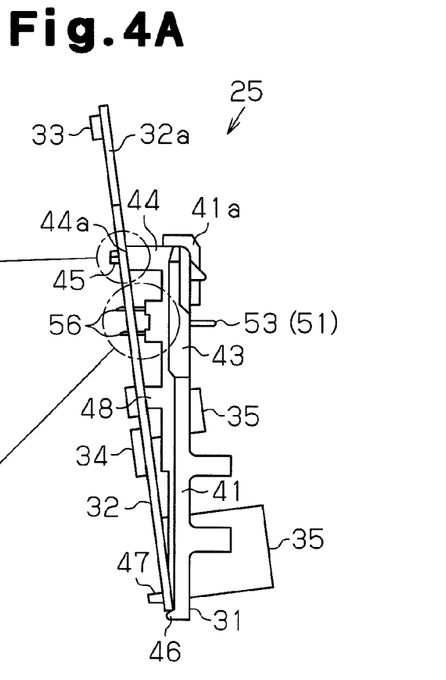
FIG. 4A is a side view illustrating the control circuit member provided on the motor of FIG. 1.
Figure 4B:
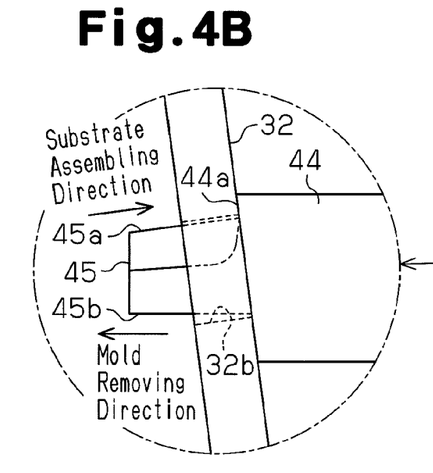
FIG. 4B is a partially enlarged view of FIG. 4A.

As shown in FIG. 4A, a pair of substrate attaching legs 44 (substrate attaching portions), which project in the direction perpendicular to the axial direction of the rotary shaft 10, are formed on the first end of the base portion 41. The substrate attaching legs 44 are formed on both widthwise ends of the base portion 41 (direction perpendicular to the sheet of FIG. 4A). In FIGS. 4A and 4B, since the pair of substrate attaching legs 44 are arranged next to one another in the widthwise direction of the substrate support member 31 (perpendicular to the sheet of the drawing), only one is shown. A securing projection 45 for securing the circuit substrate 32 is formed on a distal end surface 44*a* of one of the pair of substrate attaching legs 44. Also, a support projection 46, which supports the second end of the circuit substrate 32 in the longitudinal direction, that is, the end portion opposite to the motor main body 2, is formed on the second end of the base portion 41 in the longitudinal direction.

The circuit substrate 32 is supported by the substrate support member 31 while being inclined with respect to the axial direction of the rotary shaft 10. More specifically, the circuit substrate 32 is inclined so as to approach the axis of the rotary shaft 10 toward the first end in the longitudinal direction, that is, toward the motor main body 2. An extended portion 32*a*, which extends from the widthwise center of the circuit substrate 32, is formed on the first end of the circuit substrate 32 as shown in FIG. 4D. A rotation detecting element, which is a Hall IC 33, is mounted on the distal end of the extended portion 32*a*. That is, the circuit substrate 32 is supported in a state where the Hall IC 33 is inclined with respect to the axial direction of the base portion 41 so as to approach the sensor magnet 10*a*. The extended portion 32*a* is configured not to contact the brush holder 7.

The Hall IC 33 faces the sensor magnet 10*a* in the radial direction. The sensor magnet 10*a* and the Hall IC 33 form a rotation sensor for detecting the rotation information (such as the rotation direction and the number of rotations) of the rotary shaft 10. The Hall IC 33 detects field changes associated with the rotation of the sensor magnet 10*a*, and outputs a detection signal to a control section 34 mounted on the circuit substrate 32.

The circuit substrate 32 is assembled to the substrate support member 31 while being inclined with respect to the substrate attaching legs 44 of the substrate support member 31. As the assembling method, the securing projection 45 of the substrate attaching leg 44 is first inserted in a securing hole 32*b* formed in the circuit substrate 32 (see FIG. 4B), and the circuit substrate 32 is subsequently secured to the second end (the longitudinal end of the circuit substrate 32, and then the end opposite to the motor main body 2) of the substrate attaching leg 44 by thermally swaging the securing projection 45. The securing hole 32*b* is formed to extend in a direction perpendicular to the surface of the circuit substrate 32. Also, FIGS. 4A and 4B show the state before the securing projection 45 is thermally swaged.

Also, a pair of securing portions 47, which are connected to the second end of the circuit substrate 32 by thermal swaging, are formed at a position slightly closer to the first end than the support projection 46 of the substrate support member 31. The securing portions 47 are formed on the widthwise ends of the circuit substrate 32. FIG. 4A shows only one of the securing portions 47.

The distal end surfaces 44*a* of the substrate attaching legs 44 are inclined so as to be in surface contact with the surface of the circuit substrate 32 in a state where the circuit substrate 32 is inclined with respect to the substrate support member 31. The securing projection 45 is circular as viewed from the extending direction of the associated substrate attaching leg 44. As viewed from the widthwise direction of the substrate support member 31 (the direction perpendicular to the sheet of FIGS. 4A and 4B), an upper edge 45*a* (first edge) of the securing projection 45, that is, the edge facing the Hall IC 33 is formed along a straight line that is parallel to the assembling direction of the circuit substrate 32, and a lower edge 45*b* (second edge) of the securing projection 45, that is, the edge opposite to the Hall IC is parallel to the extending direction of the substrate attaching leg 44. Thus, during molding of the substrate support member 31, the securing projection 45 does not get caught by the mold when removing the mold of the substrate support member 31 from the substrate support member 31 in the extending direction of the associated substrate attaching leg 44. That is, the securing projection 45 is configured so as not to be undercut. Also, as described above, since the upper edge 45*a* of the securing projection 45 is formed along a straight line that is parallel to the assembling direction of the circuit substrate 32, the shape is suitable for the securing hole 32*b* of the circuit substrate 32.

A projection 48, which projects toward the circuit substrate 32, is formed at the longitudinally middle portion of the base portion 41. The distal end surface of the projection 48 is inclined so as to be in surface contact with the surface of the circuit substrate 32 in a state where the circuit substrate 32 is inclined with respect to the substrate support member 31.

Figure 4C:
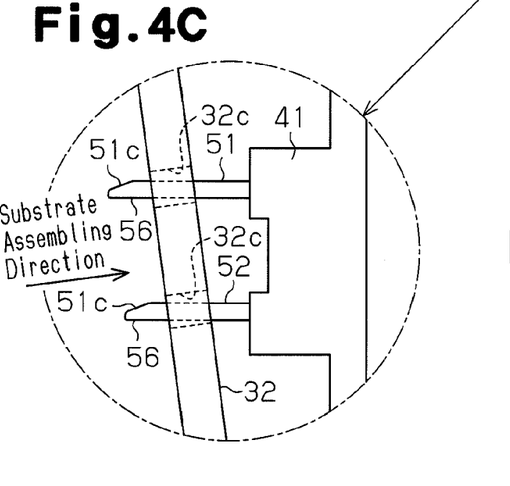
FIG. 4C is a partially enlarged view of FIG. 4A.
Figure 4D:
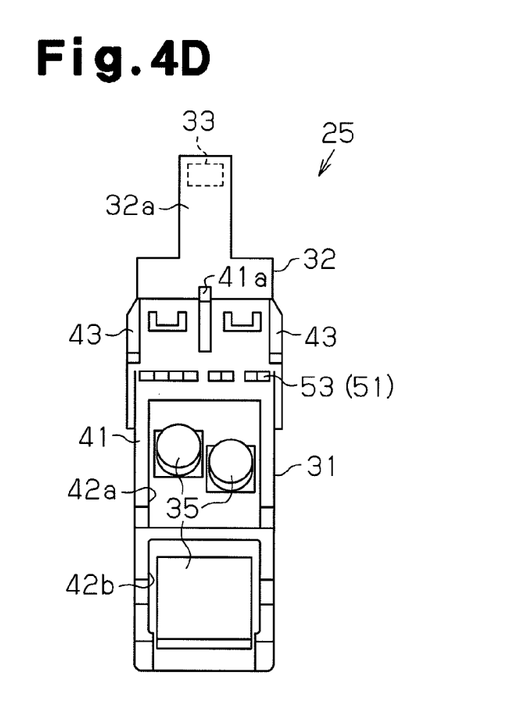
FIG. 4D is a front view illustrating the control circuit member of FIG. 4A.

Control terminals 51, 52 are provided on the base portion 41 between the substrate attaching legs 44 and the projection 48. Parts of the control terminals 51, 52 are insert-molded in the base portion 41. The control terminals 51, 52 are arranged next to one another in the widthwise direction of the substrate support member 31 (only those that are in the front of the sheet of FIGS. 4A and 4C are shown). The control terminals 51, 52 include first end portions 56, which project from the base portion 41 toward the circuit substrate 32, and second end portions 53, which project on the side of the base portion 41 opposite to the circuit substrate 32. The first end portions 56 are inserted in terminal insertion holes 32c (see FIG. 4C) formed to extend through the circuit substrate 32, and are electrically connected to the circuit substrate 32 by, for example, solder jointing. The second end portions 53 are joined to the internal connecting terminals 14 by, for example, Tig welding. The second end portions 53 are thus electrically connected to the internal connecting terminals 14.

As shown in FIG. 4C, the terminal insertion holes 32c of the circuit substrate 32 extend in a direction perpendicular to the surface of the circuit substrate 32. An inclined portion 51c is formed at the first end portion 56 of each of the control terminals 51, 52. The inclined portion 51c is formed on the upper surface of each first end portion 56, that is, on the surface facing the Hall IC. The inclination angle of the inclined portions 51c is set in accordance with the inclination of the terminal insertion holes 32c, that is, the inclination of the circuit substrate 32. Thus, when assembling the substrate support member 31 on the circuit substrate 32, the first end portions 56 of the control terminals 51, 52 do not contact parts of the circuit substrate 32 that form the terminal insertion holes 32c.

Various electrical components are mounted on both surfaces of the circuit substrate 32. Electrical components 35 (such as a relay) are mounted on the surface of the circuit substrate 32 facing the substrate support member 31, and the electrical components 35 are inserted in the insertion portions 42a, 42b of the base portion 41. Thus, the substrate support member 31 and the circuit substrate 32 can be placed near each other, thereby reducing the size of the control circuit member 25. Also, while placing the substrate support member 31 and the circuit substrate 32 near each other, the base portion 41 is extended to the second end of the circuit substrate 32 (the end close to the cover 26). Thus, the base portion 41 supports the second end of the circuit substrate 32. As a result, the circuit substrate 32 is stably supported.

Figure 3:
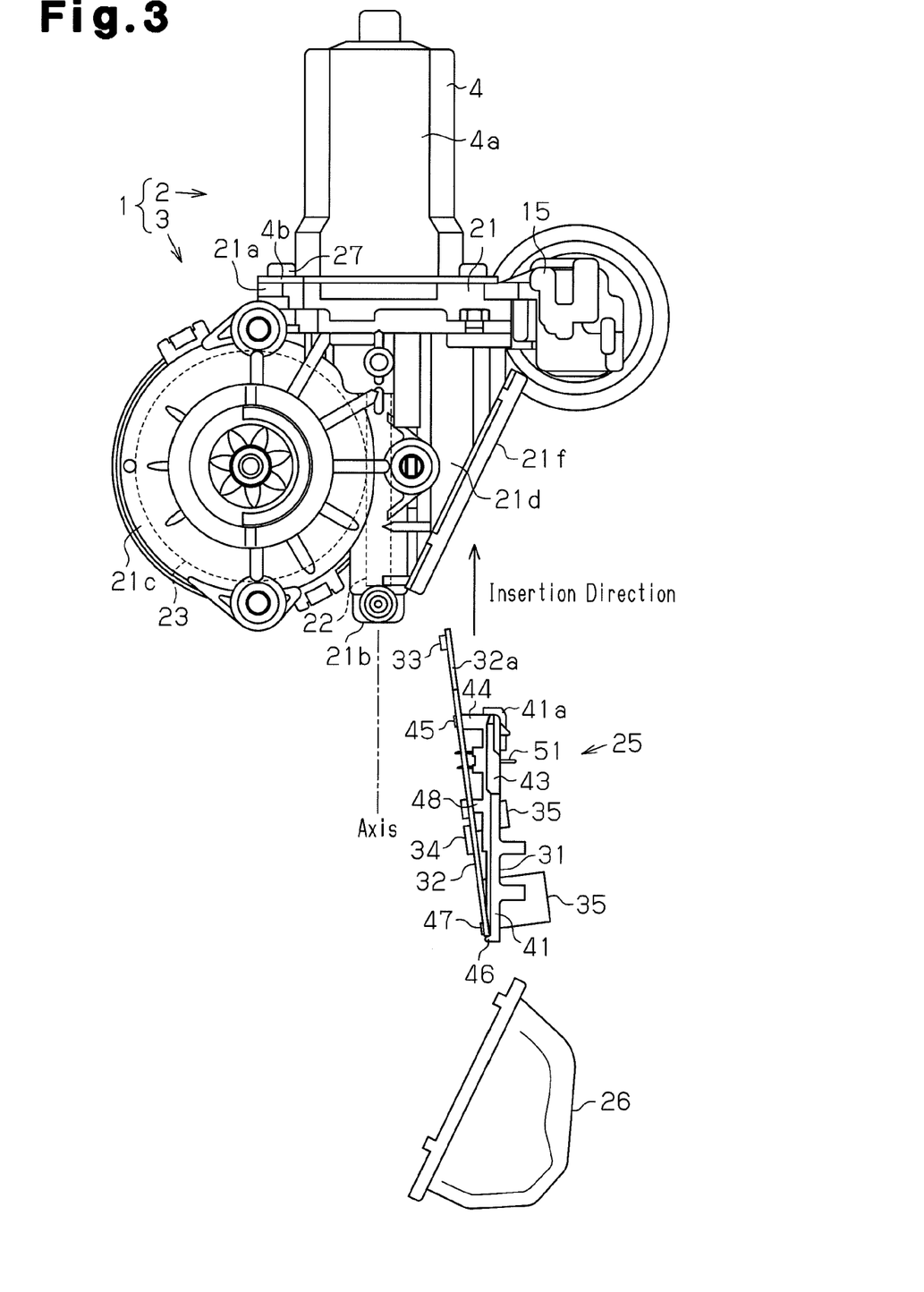
FIG. 3 is an exploded view illustrating the motor of FIG. 1.

As shown in FIG. 3, the control circuit member 25 is inserted from the opening 21f into the gear housing 21 (the circuit accommodating portion 21d) along the axial direction of the rotary shaft 10 with the motor main body 2 and the reduction section 3 assembled to each other. At this time, the press-fitting portions 43 of the substrate support member 31 are press-fitted in the circuit accommodating portion 21d with the left and right ends of the substrate support member 31 in FIG. 4D being held with a non-illustrated jig. Thus, the control circuit member 25 is secured to the circuit accommodating portion 21d. The width of the substrate support member 31, that is, the dimension of the substrate support member 31 in the left and right direction in FIG. 4D is previously set to be greater than the width of the circuit substrate 32. Thus, the non-illustrated jig and the circuit substrate 32 do not directly contact each other when holding the substrate support member 31 with the jig. When the control circuit member 25 is secured to the circuit accommodating portion 21d, the distal end of the control circuit member 25 projects from the opening 21f to the outside of the circuit accommodating portion 21d. As described above, the control circuit member 25 is assembled easily since the control circuit member 25 is assembled along the axial direction of the rotary shaft 10, which is the assembling direction of the motor main body 2 and the reduction section 3. Also, costs are reduced since special assembling equipment for assembling the control circuit member 25 from the direction other than the axial direction of the rotary shaft 10 is unnecessary.

When the control circuit member 25 is secured to the circuit accommodating portion 21d, the internal connecting terminals 14 of the brush terminals 12 and the connector terminals 13 abut against the second end portions 53 of the control terminals 51. The second end portions 53 of the control terminals 51 contact the internal connecting terminals 14 at right angle (substantially L-shaped). The second end portions 53 of the control terminals 51 and the internal connecting terminals 14 are joined by, for example, Tig welding as described above, and are electrically connected to each other.

After joining the second end portions 53 of the control terminals 51 of the control circuit member 25 to the internal connecting terminals 14, the metal cover 26 is swaged and secured to the circumference of the opening 21f of the gear housing 21 (the circuit accommodating portion 21d) to close the opening 21f. The cover 26 bulges by an amount corresponding to the projecting part of the control circuit member 25 to form a space that accommodates the part of the control circuit member 25 that projects from the opening 21f to the outside of the circuit accommodating portion 21d. The cover 26 not only closes the opening 21f, but also functions to receive heat generated by the control circuit member 25 and release the heat to the outside.

The present embodiment has the following advantages.

(1) In the present embodiment, the control circuit member 25 is inserted in the circuit accommodating portion 21d of the gear housing 21 along the axial direction of the rotary shaft 10. The circuit substrate 32 of the control circuit member 25 is inclined with respect to the axial direction of the rotary shaft 10 to bring the Hall IC 33 close to the sensor magnet 10a. Thus, while arranging the Hall IC 33 mounted on the circuit substrate 32 to face the sensor magnet 10a at a position close to the sensor magnet 10a, the circuit substrate 32 is easily assembled to the circuit accommodating portion 21d.

(2) In the present embodiment, the second edge 45b of the securing projection 45, that is, the edge opposite to the Hall IC is parallel to the extending direction of the substrate attaching legs 44 as viewed from the widthwise direction of the substrate support member 31. Thus, when pulling out the mold of the substrate support member 31 from the substrate support member 31 in the extending direction of the substrate attaching legs 44, the securing projection 45 is not undercut. Also, since the upper edge 45a of the securing projection 45, that is, the edge facing the Hall IC 33 is parallel to the assembling direction of the circuit substrate 32, the securing projection 45 is formed into a shape suitable for the securing hole 32b of the circuit substrate 32.

(3) In the present embodiment, the insertion portions 42a, 42b are formed in the substrate support member 31 such that the electrical components 35 mounted on the surface of the circuit substrate 32 facing the substrate support member 31 are inserted in the substrate support member 31. Thus, the substrate support member 31 and the circuit substrate 32 are brought close to each other, and as a result, the size of the control circuit member 25 is reduced. This also prevents reduction in the flexibility of layout of parts that support the circuit substrate 32 on the substrate support member 31, that is, the substrate attaching legs 44, the support projection 46, the securing portion 47, and the projection 48. As a result, the circuit substrate 32 is stably held.

(4) In the present embodiment, the inclined portions 51c are formed on the first end portions 56 of the control terminals 51, 52. The inclined portions 51c allows the first end portions 56 to avoid contacting the terminal insertion holes 32c when assembling the substrate support member 31 to the circuit substrate 32. This allows the control terminals 51, 52 to be arranged perpendicular to the axial direction of the rotary shaft 10, thus facilitating the manufacture of the substrate support member 31.

A second embodiment of the present invention will now be described with reference to FIGS. 5A to 6. Like or the same reference numerals are given to those components that are like or the same as the corresponding components of the first embodiment, and drawings and all or part of explanations are omitted.

Figures 5A, 5D:
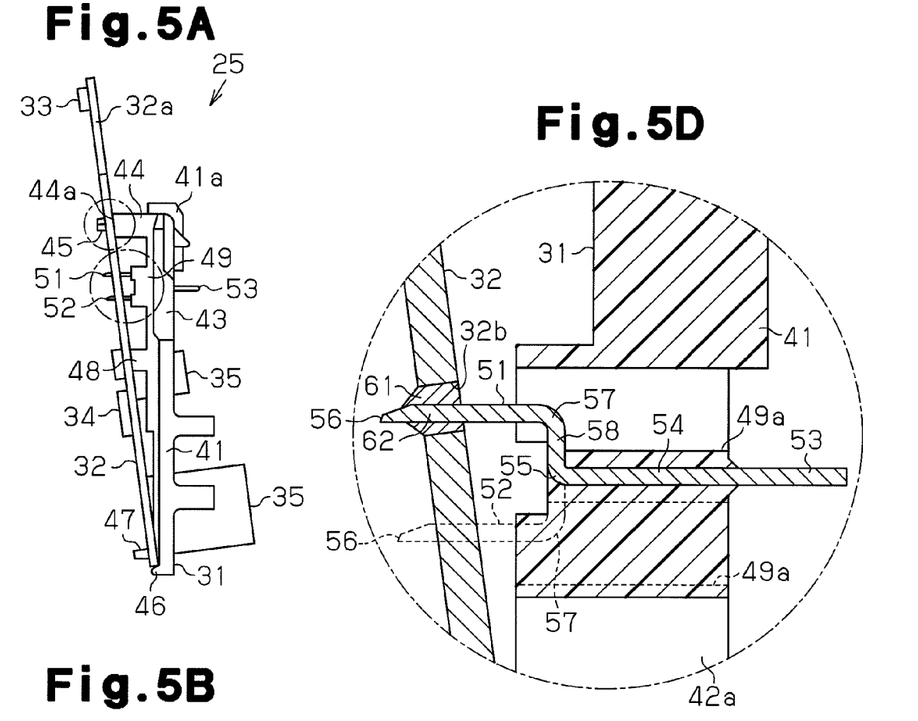
FIG. 5A is a side view illustrating a control circuit member of a motor according to a second embodiment of the present invention.
FIG. 5D is a cross-sectional view taken along line 5D-5D of FIG. 5C.

As shown in FIG. 5A, the base portion 41 of the present embodiment includes a terminal retaining portion 49 for retaining the control terminals 51, 52 between the substrate attaching legs 44 and the projection 48. In the present embodiment, the total of nine control terminals 51, 52 are embedded in the terminal retaining portion 49.

Figure 5B:
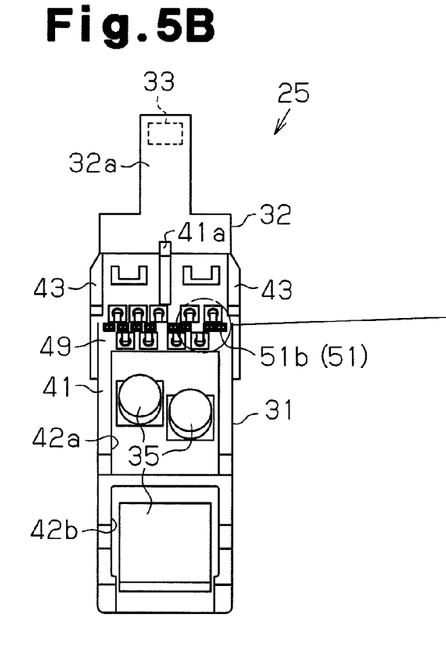
FIG. 5B is a front view illustrating the control circuit member of FIG. 5A.
Figure 5C:
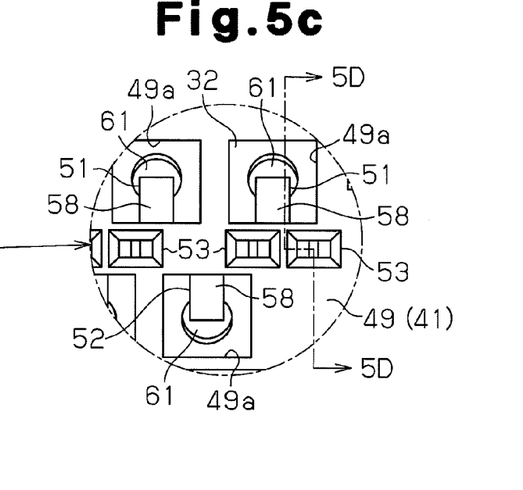
FIG. 5C is an enlarged view illustrating the connection terminals of FIG. 5B and the vicinity thereof.

The second end portions 53 of the control terminals 51, 52 are arranged next to one another in the widthwise direction of the substrate support member 31 (see FIG. 5B). Also, the second end portions 53 of the control terminals 51, 52 are parallel to the extending direction of the substrate attaching legs 44.

As shown in FIG. 5D, retained portions 54 of the control terminals 51, 52 are embedded in and retained by the terminal retaining portion 49. The retained portions 54 each include a second bent portion 55, which is bent substantially at right angle with respect to the extending direction of the second end portions 53 of the control terminals 51, 52. Among the control terminals 51, 52, ones that are bent toward the first end of the base portion 41 at the second bent portions 55 are referred to as first control terminals 51, and ones that are bent toward the second end of the base portion 41 at the second bent portions 55 are referred to as second control terminals 52. The number of the first control terminals 51 is five, and the number of the second control terminals 52 is four.

A first bent portion 57 is formed between the retained portion 54 and the first end portion 56 of each of the control terminals 51, 52. The first bent portion 57 is bent at right angle with respect to the extending direction of the second end portions 53 of the control terminals 51, 52. A middle portion 58, which is a part between the first bent portion 57 and the second bent portion 55 of each of the control terminals 51, 52, is parallel to the longitudinal direction of the base portion 41, that is, the vertical direction in FIG. 5D. Also, parts of the control terminals 51, 52 from the second bent portions 55 to the second end portions 53, and parts of the control terminals 51, 52 from the first bent portions 57 to the first end portions 56, are parallel to the front and rear direction of the base portion 41, that is, to a direction perpendicular to the longitudinal direction of the base portion 41. In other words, the parts are parallel to the left and right direction in FIG. 5D. That is, the control terminals 51, 52 are formed into a crank shape by the first and second bent portions 57, 55. Also, the retained portions 54 of the control terminals 51, 52 are bent into a crank shape in the widthwise direction of the base portion 41, that is, in the left and right direction in FIG. 5B. Thus, the positions of the first end portions 56 and the second end portions 53 of the control terminals 51, 52 are displaced in the widthwise direction of the base portion 41.

Through holes 49a corresponding to the control terminals 51, 52 are formed in the terminal retaining portion 49. The through holes 49a are formed to extend through the terminal retaining portion 49 in the extending direction of the second end portions 53 and the first end portions 56 of the control terminals 51, 52, that is, in the front and rear direction of the base portion 41. The middle portions 58 of the control terminals 51, 52 project from the terminal retaining portion 49 into the respective through holes 49a, and the first bent portions 57 are formed at the projecting portions. That is, the first bent portions 57 are configured to be arranged in the through holes 49a. The first bent portions 57 are not embedded in the substrate support member 31 and are exposed to the outside from the substrate support member 31. That is, the through holes 49a are formed at positions corresponding to the first bent portions 57 of the control terminals 51, 52. Five through holes 49a are formed closer to the first end of the base portion 41 than the second end portions 53 of the control terminals 51, 52. Four through holes 49a are formed closer to the second end of the base portion 41 than the second end portions 53 of the control terminals 51, 52. Since the first bent portions 57 of the control terminals 51, 52 are exposed in the through holes 49a as described above, the first bent portions 57 do not contact the base portion 41. Thus, parts of the control terminals 51, 52 from the retained portions 54 to the first end portions 56 are flexible.

Each of the first end portions 56 of the control terminals 51, 52 projects from the corresponding through hole 49a toward the circuit substrate 32. The first end portions 56 are inserted in the terminal insertion holes 32c formed in the circuit substrate 32, and joined with the circuit substrate 32 by, for example, solder joints 61. The solder joints 61 electrically connect the control terminals 51, 52 to the circuit substrate 32. Thus, the circuit substrate 32 and the internal connecting terminals 14 of the motor 1 are electrically connected via the control terminals 51, 52.

Figure 6:
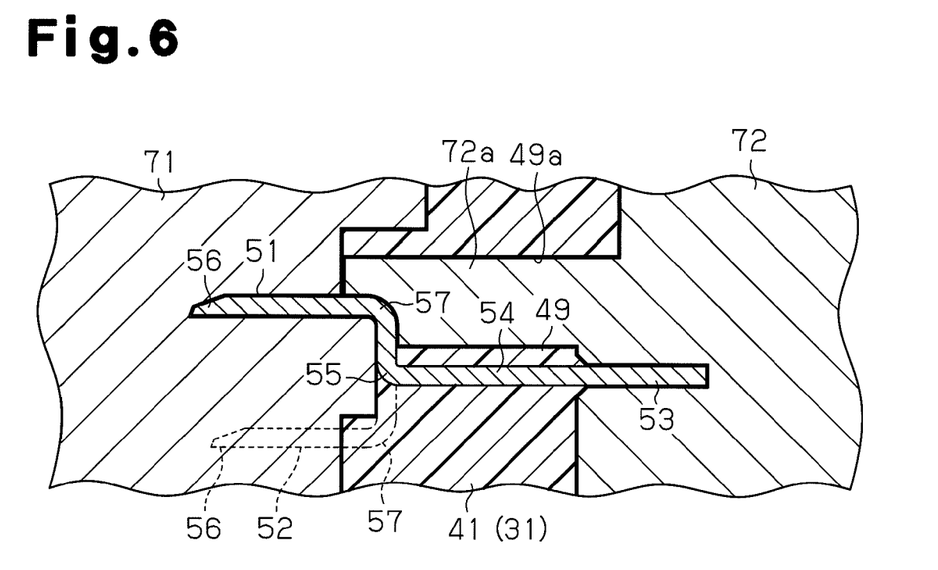
FIG. 6 is a partial cross-sectional view illustrating the molding manner of the control circuit member of FIG. 5A.

As shown in FIG. 6, two molds 71, 72 are prepared when integrally molding (insert molding) the control terminals 51, 52 on the substrate support member 31. The control terminals 51, 52 are placed in the molds 71, 72 and a resin material is poured into the cavity formed between the molds 71, 72. In the present embodiment, a first mold 71 supports the first end portions 56 of the control terminals 51, 52, and a second mold 72 supports the second end portions 53 of the control terminals 51, 52. The second mold 72 has extended portions 72a, which extend toward the first mold 71 and support the first bent portions 57 of the control terminals 51, 52. After the resin material forming the substrate support member 31 has hardened, the first and second molds 71, 72 are removed from the control terminals 51, 52 along the extending direction of the first end portions 56 and the second end portions 53 of the control terminals 51, 52, that is, in the front and rear direction of the substrate support member 31. The through holes 49a are formed by the extended portions 72a of the second mold 72. In this manner, since the control terminals 51, 52 are bent into the crank shape by the first and second bent portions 57, 55 in the present embodiment, the first and second molds 71, 72 that are removed along the extending direction of the first end portions 56 and the second end portions 53 of the control terminals 51, 52 can be used. That is, an integrally molded product of the substrate support member 31 and the control terminals 51, 52 is molded with only the first and second molds 71, 72 (upper and lower molds).

In the above-mentioned control circuit member 25, the substrate support member 31 and the circuit substrate 32 might expand and deform due to the heat inside the circuit accommodating portion 21d. This generates, for example, stress that causes positional displacement between the joints 62 of the control terminals 51, 52 and the corresponding retained portions 54 along the longitudinal direction of the base portion 41. In this case, since the first bent portions 57 are formed between the joints 62 of the control terminals 51, 52 and the retained portions 54, the stress concentrates at the first bent portions 57. Thus, excessive force is not applied to the joints 62 of the control terminals 51, 52, which improves the stability of the electrical connection between the joints 62 and the electrical components 35. Also, since excessive force is also not applied to the terminal retaining portion 49, the control terminals 51, 52 are stably retained.

The present embodiment has the following advantages.

(5) In the present embodiment, parts of the control terminals 51, 52 from the retained portions 54 embedded in and retained by the substrate support member 31 to the joints 62 connected to the circuit substrate 32 project from the substrate support member 31, and the first bent portions 57 are formed at the projecting portions. Thus, even when positional displacement occurs between the joints 62 of the control terminals 51, 52 and the retained portions 54 by the thermal expansion (or heat contraction) of the circuit substrate 32 and the substrate support member 31, excessive force is not applied to the joints 62 of the control terminals 51, 52 joined to the circuit substrate 32. As a result, the stability of the electrical connection between the joints 62 and the electrical components 35 is improved.

(6) In the present embodiment, the control terminals 51, 52 include the second bent portions 55 formed in the retained portions 54, and are bent into the crank shape by the first and second bent portions 57, 55. Thus, the first and second molds 71, 72 can be removed along the extending direction of the terminals 51, 52 when integrally molding (insert molding) the control terminals 51, 52 on the substrate support member 31, and the molding is performed with only the first and second molds 71, 72 (upper and lower molds).

(7) In the present embodiment, the through holes 49a, which extend along the extending direction of the first end portions 56 and the second end portions 53 of the control terminals 51, 52, are formed in the substrate support member 31 such that the middle portions 58 project from the base portion 41 of the substrate support member 31. The middle portions 58 are the projecting parts of the control terminals 51, 52 including the first bent portions 57. Thus, arranging the projecting parts of the control terminals 51, 52 including the first bent portions 57 in the through holes 49a formed in the substrate support member 31 reduces the influence on the outer shape of the substrate support member 31. This increases the flexibility of design of the outer shape of the substrate support member 31.

(8) In the present embodiment, since the press-fitting portions 43, which serve as the attaching portions that engage with the inner wall of the circuit accommodating portion 21d, are formed on the substrate support member 31, extra components for attaching the control circuit member 25 on the motor 1 are unnecessary. This prevents increase in the number of components.

The embodiments of the present invention may be modified as follows.

In each of the above embodiments, only one securing projection 45 is provided, but two or more securing projections 45 may be provided. Also, the securing portion 47 of the present embodiment may have substantially the same structure as the securing projection 45.

In each of the above embodiments, the Hall IC 33 is used as the rotation detecting element, but for example, a magnetic resistance element may be used.

In each of the above embodiments, the present invention is embodied in the control circuit member 25 provided in the motor 1 for power window apparatus, but may be applied to motors other than the motor 1 for power window apparatus. Also, the present invention may be applied to a circuit component provided in apparatuses other than motors. For example, the present invention may be applied to a motor for other apparatuses such as a sunroof apparatus, a slide door apparatus, and a back door apparatus.

In the second embodiment, the first bent portions 57 of the control terminals 51, 52 are configured to be located in the through holes 49a, but may also be located, for example, outside the through holes 49a and on the end of the through holes 49a closer to the circuit substrate 32. The through holes 49a are formed at positions corresponding to the first bent portions 57 of the control terminals 51, 52 (at positions where the first bent portions 57 and the base portion 41 overlap in the front and rear direction).

In the second embodiment, the control terminals 51, 52 are formed into the crank shape by the first bent portions 57 and the second bent portions 55, but the control terminals 51, 52 may be formed into, for example, an L-shape by omitting the second bent portions 55.

In the second embodiment, several (nine in total) control terminals 51, 52 are provided. However, one to eight, or ten or more control terminals 51, 52 may be provided.

In each of the above embodiments, the press-fitting portions 43, which serve as the attaching portions to the motor 1, are provided on the substrate support member 31. However, the press-fitting portions 43 may be omitted and a member for attaching the control circuit member 25 to the motor 1 may be separately provided.

In each of the above embodiments, the circuit substrate 32 is inclined with respect to the axial direction of the rotary shaft 10. However, the circuit substrate 32 may be parallel to the rotary shaft 10.

What is claimed is:

1. A control circuit member provided in a motor including a motor main body having a rotary shaft and a gear housing, which is integrated with the motor main body and accommodates a reduction gear for reducing rotation speed of the rotary shaft, the control circuit member comprising:
   a circuit substrate, which is accommodated in a circuit accommodating portion provided in the gear housing;
   a rotation detecting element mounted on the circuit substrate, the rotation detecting element being arranged to face a detector magnet that is provided on and rotate integrally with the rotary shaft; and
   a substrate support member for supporting the circuit substrate in the circuit accommodating portion;
   wherein the control circuit member is configured to be insertable into the circuit accommodating portion along an insertion direction parallel to the axial direction of the rotary shaft,
   wherein the circuit substrate is configured to be arrangeable inside the circuit accommodating portion while being inclined with respect to the axial direction of the rotary shaft, so as to cause the rotation detecting element to approach the detector magnet,
   wherein the substrate support member includes a substrate attaching portion, which extends in a direction perpendicular to the axial direction of the rotary shaft, the substrate attaching portion has a distal end surface, which is inclined with respect to the axial direction of the rotary shaft so as to be in surface contact with an surface of the circuit substrate in a state where the circuit substrate is assembled to the substrate support member while being inclined with respect to the substrate attaching portion.

2. The control circuit member according to claim 1, wherein the substrate support member includes:
   a base portion, which extends parallel to the axial direction of the rotary shaft; and
   a substrate attaching portion, which extends perpendicularly from the base portion and includes a securing projection at the distal end,
   wherein the circuit substrate includes a securing hole in which the securing projection is inserted, and when the securing projection is inserted in the securing hole along an assembling direction, which is inclined with respect to the extending direction of the substrate attaching portion, the circuit substrate is assembled to the substrate support member with the circuit substrate being inclined with respect to the substrate attaching portion, and wherein the securing projection includes a first edge close to the rotation detecting element and a second edge opposite to the rotation detecting element as viewed from a widthwise direction of the substrate support member, the first edge extending parallel to the assembling direction of the circuit substrate, and the second edge extending parallel to the extending direction of the substrate attaching portion.

3. The control circuit substrate according to claim 1, wherein the substrate support member includes an insertion portion in which an electrical component mounted on the surface of the circuit substrate facing the substrate support member is inserted.

4. The control circuit member according to claim 1, wherein the substrate support member includes a terminal extending perpendicular to the axial direction of the rotary shaft, and the terminal is inserted in a terminal insertion hole formed through the circuit substrate and is electrically connected to the circuit substrate, and wherein the end of the terminal has an inclined portion that allows the terminal to avoid contacting the part of the circuit substrate where the terminal insertion hole is formed when the terminal is inserted in the terminal insertion hole.

5. The control circuit member according to claim 4, wherein the terminal includes a retained portion embedded in and retained by the substrate support member, a joint connected to the circuit substrate, and a bent portion formed between the retained portion and the joint, and wherein the bent portion is not embedded in the substrate support member and is exposed to the outside from the substrate support member.

6. The control circuit substrate according to claim 5, wherein the bent portion is a first bent portion and the terminal further includes a second bent portion formed in the retained portion, and the terminal is formed into a crank shape by the first and second bent portion.

7. The control circuit member according to claim 6, wherein the substrate support member includes a through hole, which extends along the extending direction of the ends of the terminal, and the first bent portion is exposed to the inside of the through hole.

8. The control circuit member according to claim 1, wherein the substrate support member includes a attaching portion engaged with the inner wall of the circuit accommodating portion.

9. A motor comprising:
a motor main body including a rotary shaft;
a gear housing integrated with the motor main body, the gear housing accommodating a reduction gear for reducing rotation speed of the rotary shaft; and
a control circuit member accommodated in a circuit accommodating portion provided in the gear housing,
wherein the control circuit member includes:
a circuit substrate accommodated in the circuit accommodating portion provided in the gear housing, the circuit substrate being arranged to face a detector magnet that is provided on and rotates integrally with the rotary shaft; and
a substrate support member for supporting the circuit substrate in the circuit accommodating portion, wherein the circuit accommodating portion is configured to receive the control circuit member along the axial direction of the rotary shaft, and wherein the circuit substrate is configured to be arrangeable inside the circuit accommodating portion while being inclined with respect to the axial direction of the rotary shaft, so as to cause the rotation detecting element to approach the detector magnet wherein the substrate support member includes a substrate attaching portion, which extends in a direction perpendicular to the axial direction of the rotary shaft, the substrate attaching portion has a distal end surface, which is inclined with respect to the axial direction of the rotary shaft so as to be in surface contact with an surface of the circuit substrate in a state where the circuit substrate is assembled to the substrate support member while being inclined with respect to the substrate attaching portion.

10. The control circuit member according to claim 1, wherein a securing projection for securing the circuit substrate is formed on the distal end surface of the substrate attaching portion.

11. The control circuit member according to claim 1, wherein the circuit substrate is assembled to the substrate support member so that the circuit substrate is inclined with respect to the axial direction of the rotary shaft at an angle smaller than an angle of the circuit substrate with respect to the radial direction of the rotary shaft.

12. A control circuit member provided in a motor including a motor main body having a rotary shaft and a gear housing, which is integrated with the motor main body and accommodates a reduction gear for reducing rotation speed of the rotary shaft, a detector magnet being provided on the rotary shaft to rotate integrally with the rotary shaft, the control circuit member comprising:
a circuit substrate, which is accommodated in a circuit accommodating portion provided in the gear housing;
a rotation detecting element mounted on the circuit substrate, the rotation detecting element being, arranged to face the detector magnet in the radial direction of the rotary shaft; and
a substrate support member for supporting the circuit substrate in the circuit accommodating portion;
wherein the control circuit member is configured to be insertable into the circuit accommodating portion along an insertion direction parallel to the axial direction of the rotary shaft,
wherein the circuit substrate is configured to be arrangeable inside the circuit accommodating portion while being inclined with respect to the axial direction of the rotary shaft, so as to cause the rotation detecting element to approach the detector magnet in the radial direction of the rotary shaft, and
wherein the circuit substrate is assembled to the substrate support member so that the circuit substrate is inclined with respect to the axial direction of the rotary shaft at an angle smaller than an angle of the circuit substrate with respect to the radial direction of the rotary shaft; wherein the substrate support member includes a substrate attaching portion, which extends in a direction perpendicular to the axial direction of the rotary shaft, the substrate attaching portion has a distal end surface, which is inclined with respect to the axial direction of the rotary shaft so as to be in surface contact with an surface of the circuit substrate in a state where the circuit substrate is assembled to the substrate support member while being inclined with respect to the substrate attaching portion.

13. The control circuit member according to claim 12, wherein the substrate support member includes a base portion, which extends parallel to the axial direction of the rotary shaft, and a substrate attaching portion, which extends perpendicularly from the base portion, the base portion having opposite first and second ends in the axial direction of the rotary shaft, the substrate attaching portion being provided at the first end, and wherein the circuit substrate is connected to a distal end of the substrate attaching portion and the second end of the base portion so that the circuit substrate is inclined with respect to the base portion at an angle smaller than an angle of the circuit substrate with respect to the substrate attaching portion.

* * * * *